United States Patent
Matsuzawa

(10) Patent No.: US 7,684,251 B2
(45) Date of Patent: Mar. 23, 2010

(54) NON-VOLATILE SEMICONDUCTOR MEMORY DEVICE AND ITS WRITING METHOD

(75) Inventor: Kazuya Matsuzawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/211,467

(22) Filed: Sep. 16, 2008

(65) Prior Publication Data

US 2009/0244981 A1    Oct. 1, 2009

(30) Foreign Application Priority Data

Mar. 26, 2008    (JP) .............................. 2008-081126

(51) Int. Cl.
 *G11C 11/34* (2006.01)
 *G11C 16/06* (2006.01)
(52) U.S. Cl. .............................. 365/185.23; 365/185.18
(58) Field of Classification Search ............ 365/185.23, 365/185.18, 185.28
See application file for complete search history.

(56) References Cited

U.S. PATENT DOCUMENTS

| | | | | |
|---|---|---|---|---|
| 5,898,621 A | * | 4/1999 | Takahashi et al. | 365/185.33 |
| 6,434,053 B1 | * | 8/2002 | Fujiwara | 365/185.28 |
| 6,501,683 B2 | * | 12/2002 | Takahashi | 365/185.25 |
| 6,556,481 B1 | * | 4/2003 | Hsu et al. | 365/185.24 |

OTHER PUBLICATIONS

Liyang Pan, et al., Novel Self-Convergent Programming Method Using Source-Induced Band-to-Band Hot Electron Injection, IEEE Electron Device Letters, vol. 23, No. 11, Nov. 2002, pp. 652-654.

* cited by examiner

*Primary Examiner*—Anh Phung
(74) *Attorney, Agent, or Firm*—Oblon, Spivak, McClelland, Maier & Neustadt, L.L.P.

(57) ABSTRACT

It is made possible to provide a non-volatile semiconductor memory device capable of improving the writing efficiency and its writing method. Predetermined voltages are respectively applied to a drain region and a control gate, and then the voltage applied to the control gate is opened.

9 Claims, 10 Drawing Sheets

NON-VOLATILE SEMICONDUCTOR MEMORY DEVICE AND ITS WRITING METHOD

CROSS-REFERENCE TO RELATED APPLICATION

This application is based upon and claims the benefit of priority from prior Japanese Patent Application No. 2008-81126 filed on Mar. 26, 2008 in Japan, the entire contents of which are incorporated herein by reference.

BACKGROUND OF THE INVENTION

1. Field of the Invention

The present invention relates to a non-volatile semiconductor memory device and its writing method. In particular, the present invention relates to a NOR type flash memory and its writing method.

2. Related Art

In general, the NOR type flash memory has a plurality of memory cells arranged in a matrix form. Each memory cell includes a source region and a drain region formed in a semiconductor substrate, a gate insulation film formed on the semiconductor substrate to serve as a channel region between the source region and the drain region, a floating gate formed on the gate insulation film, an inter-electrode insulation film formed on the floating gate, and a control gate formed on the inter-electrode insulation film.

A memory cell in a column shares the source region or drain region with adjacent memory cells in the same column. Drain regions of memory cells in the same column are connected to a common bit line in parallel via bit line contacts. Control gates respectively of memory cells in the same row are connected to a common word line.

In the NOR type flash memory having such a configuration, threshold adjustment (writing) of each memory cell is conducted by injecting channel hot electrons, which are generated by applying predetermined voltages to the control gate and the drain region and connecting the source region and the semiconductor substrate to the ground potential, into the floating gate. In the NOR type flash memory, therefore, it is important to the writing efficiency to generate channel hot electrons by the drain voltage. As one of techniques for increasing the writing efficiency, it is conducted to increase the hot electrons by forming a bipolar transistor in the drain region (see, for example, Liyang Pan, Jun Zhu, Zhihong Liu, Ying Zeng, and Jianzhao Liu, "Novel Self-Convergent Programming Method Using Source-Induced Band-to-Band Hot Electron Injection," IEEE ELECTRON DEVICE LETTERS, VOL. 23, NO. 11, P. 652, NOVEMBER 2002).

In the NOR type flash memory, however, the gate electrode length is made fine in order to implement high integration. As a result, parasitic resistance such as diffusion layer resistance and contact resistance becomes large relatively. Therefore, the effective drain voltage applied to the channel region is getting lower and lower. This results in a problem that the writing efficiency is reduced.

SUMMARY OF THE INVENTION

The present invention has been made in view of these circumstances, and an object thereof is to provide a non-volatile semiconductor memory device capable of improving the writing efficiency and its writing method.

According to a first aspect of the present invention, there is provided a non-volatile semiconductor memory device including: a memory cell array; the memory cell array comprising: a plurality of non-volatile memory cells each including a source region and a drain region formed in a semiconductor substrate so as to be separated from each other, a gate insulation film formed on a region of the semiconductor substrate which serves as a channel region between the source region and the drain region, a floating gate formed on the gate insulation film, an inter-electrode insulation film formed on the floating gate, and a control gate formed on the inter-electrode insulation film; bit lines, to each of which the drain regions of the non-volatile memory cells in an identical column direction are connected in common, the source regions of the non-volatile memory cells in an identical column direction being connected to ground in common; word lines, to each of which the control gates of the non-volatile memory cells in an identical row direction are connected in common; a word line drive circuit configured to select one of the word lines based on a row address signal and apply a predetermined voltage to the selected word line; and a write circuit configured to generate a write voltage on the basis of write data, select one of the bit lines on the basis of a column address signal, and apply the write voltage to the selected bit line, wherein the word line drive circuit applies the predetermined voltage to the selected word line during a write operation, and then opens the voltage applied to the selected word line.

According to a second aspect of the present invention, there is provided a non-volatile semiconductor memory device including: a non-volatile memory cell comprising a source region and a drain region formed in a semiconductor substrate so as to be separated from each other, a gate insulation film formed on a region of the semiconductor substrate which serves as a channel region between the source region and the drain region, a floating gate formed on the gate insulation film, an inter-electrode insulation film formed on the floating gate, and a control gate formed on the inter-electrode insulation film, source region being connected to ground; a bit line connected to the drain region of the non-volatile memory cell; a word line connected to the control gate of the non-volatile memory cell; a word line drive circuit configured to apply a predetermined voltage to the word line; and a write circuit configured to generate a write voltage on the basis of write data, and apply the write voltage to the bit line, wherein the word line drive circuit applies the predetermined voltage to the word line during a write operation, and then opens the voltage applied to the word line.

According to a third aspect of the present invention, there is provided a writing method for a non-volatile semiconductor memory device, the non-volatile semiconductor memory device including: a memory cell array; the memory cell array comprising: a plurality of non-volatile memory cells each including a source region and a drain region formed in a semiconductor substrate so as to be separated from each other, a gate insulation film formed on a region of the semiconductor substrate which serves as a channel region between the source region and the drain region, a floating gate formed on the gate insulation film, an inter-electrode insulation film formed on the floating gate, and a control gate formed on the inter-electrode insulation film; bit lines, to each of which drain regions of the non-volatile memory cells in an identical column direction are connected in common, and source regions of non-volatile memory cells in an identical column direction are connected to ground in common; and word lines, to each of which the control gates of the non-volatile memory cells in an identical row direction are connected in common, the writing method comprising: selecting one of the word lines on the basis of a row address signal and applying a predetermined voltage to the selected word line; generating a write voltage on the basis of write data, selecting one of the bit lines on the basis of a column address signal, and applying the write voltage to the selected bit line, applying the predetermined voltage to the selected word line during a write operation, and then opening the voltage applied to the selected word line.

DETAILED DESCRIPTION OF THE INVENTION

Hereafter, embodiments of the present invention will be described with reference to the drawings.

First Embodiment

A non-volatile semiconductor memory device according to a first embodiment of the present invention will now be described with reference to FIGS. 1 to 9. The non-volatile semiconductor memory device according to the present embodiment is a NOR type flash memory. As shown in FIG. 2, the non-volatile semiconductor memory device according to the present embodiment includes a memory cell array formed by arranging a plurality of memory cells MC in a matrix form, a write circuit 20, a word line drive circuit 30 and a read circuit 40.

Figure 1:
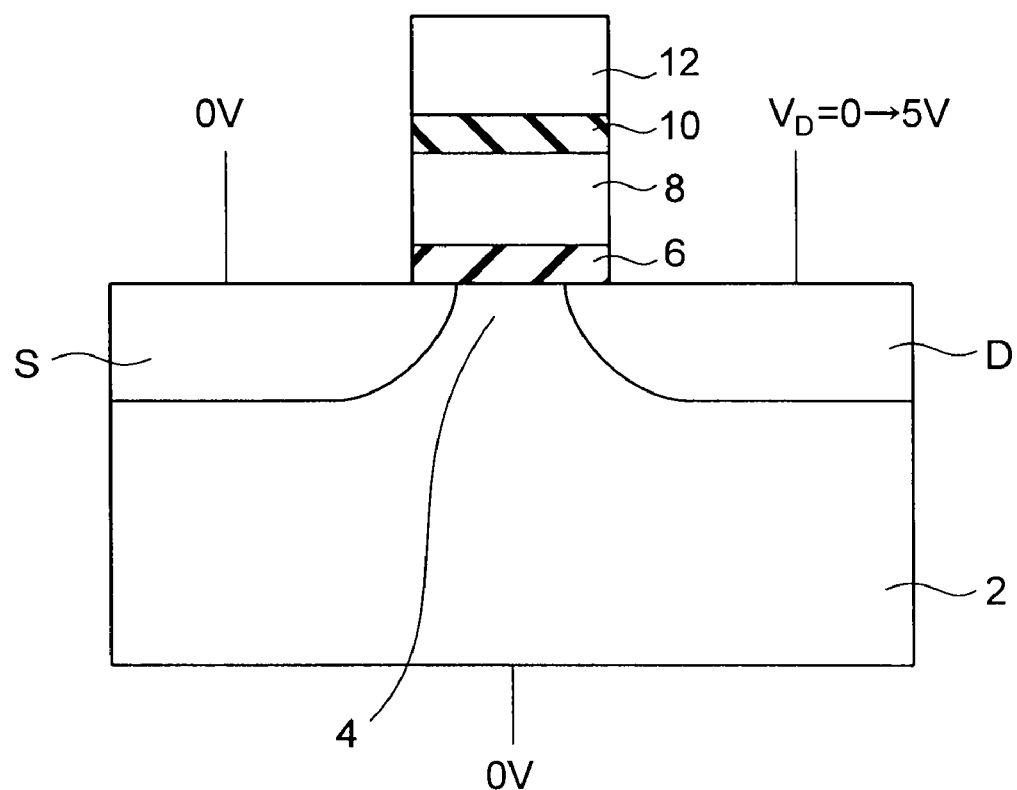
FIG. 1 is a sectional view showing a memory cell of a non-volatile semiconductor memory device according to a first embodiment.
Figure 2:
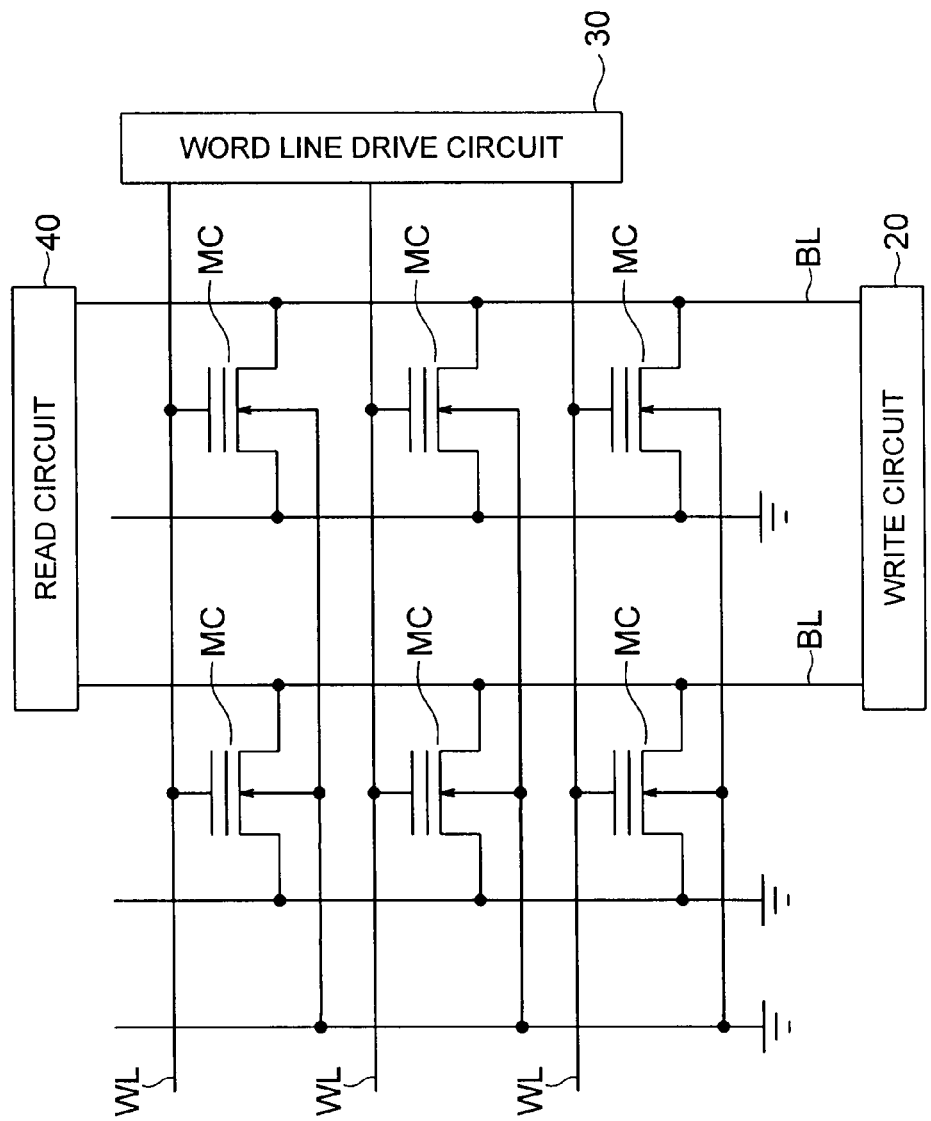
FIG. 2 is a circuit diagram showing the non-volatile semiconductor memory device according to the first embodiment.

As shown in FIG. 1, each memory cell MC includes a source region S and a drain region D formed in a semiconductor substrate 2 formed of, for example, silicon, a gate insulation film 6 formed on a region of the semiconductor substrate 2 which serves as a channel region 4 between the source region S and the drain region D, a floating gate 8 formed on the gate insulation film 6, an inter-electrode insulation film 10 formed on the floating gate 8, and a control gate 12 formed on the inter-electrode insulation film 10.

Figure 3:
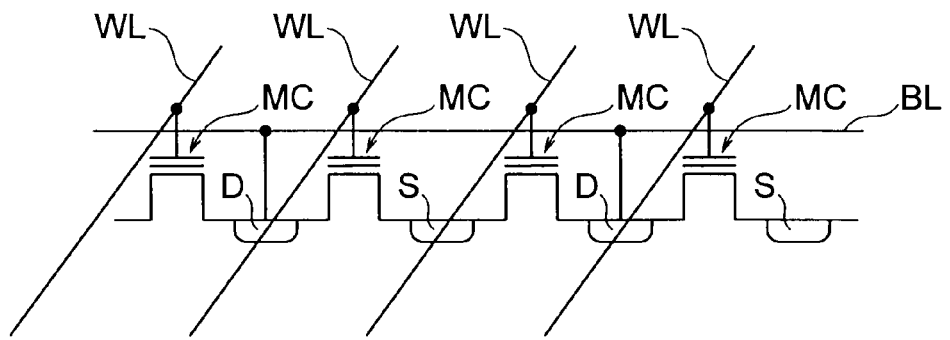
FIG. 3 is a diagram showing a configuration of a first example of a typical NOR type flash memory.

As shown in FIG. 3, a memory cell in a column shares a source region S or a drain region D with adjacent memory cells MC in the same column. By the way, only memory cells MC in the same column are shown in FIG. 3. Drain regions D of memory cells MC in the same column are connected to a common bit line BL in parallel via bit line contacts (not illustrated). Control gates 12 respectively of memory cells MC in the same row are connected to a common word line WL.

Figure 4:
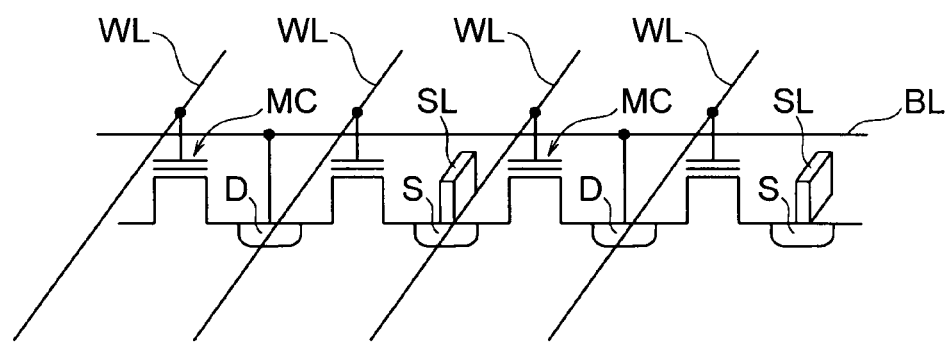
FIG. 4 is a diagram showing a configuration of a second example of the typical NOR type flash memory.

A NOR type flash memory having a structure in which the ground potential is supplied via the source regions S of respective memory cells MC is shown in FIG. 3. Alternatively, a structure in which source regions S of the memory cells MC in the same row are connected to source lines SL disposed under the bit line BL and the ground potential is supplied via the source lines SL as shown in FIG. 4 may be used.

In general, in the NOR type flash memory having such a configuration, threshold adjustment (writing) in each memory cell MC is conducted by selecting a word line WL by using the word line drive circuit 30 on the basis of a row address signal, applying a predetermined voltage (for example, 10 V) to the control gates 12 of memory cells MC connected to the selected word line WL, selecting a bit line BL by using the write circuit 20 on the basis of a column address signal, applying a predetermined voltage (for example, 5 V) to the drain regions D of memory cells connected to the selected bit line BL on the basis of write data, providing the source region S and the semiconductor substrate 2 with the ground potential, and injecting resultant channel hot electrons into the floating gate FG. If each memory cell MC stores one data, a constant voltage is applied to the bit line BL. If each memory cell MC stores multi-value data, a voltage depending upon write data is applied to the bit line BL.

Figure 5:
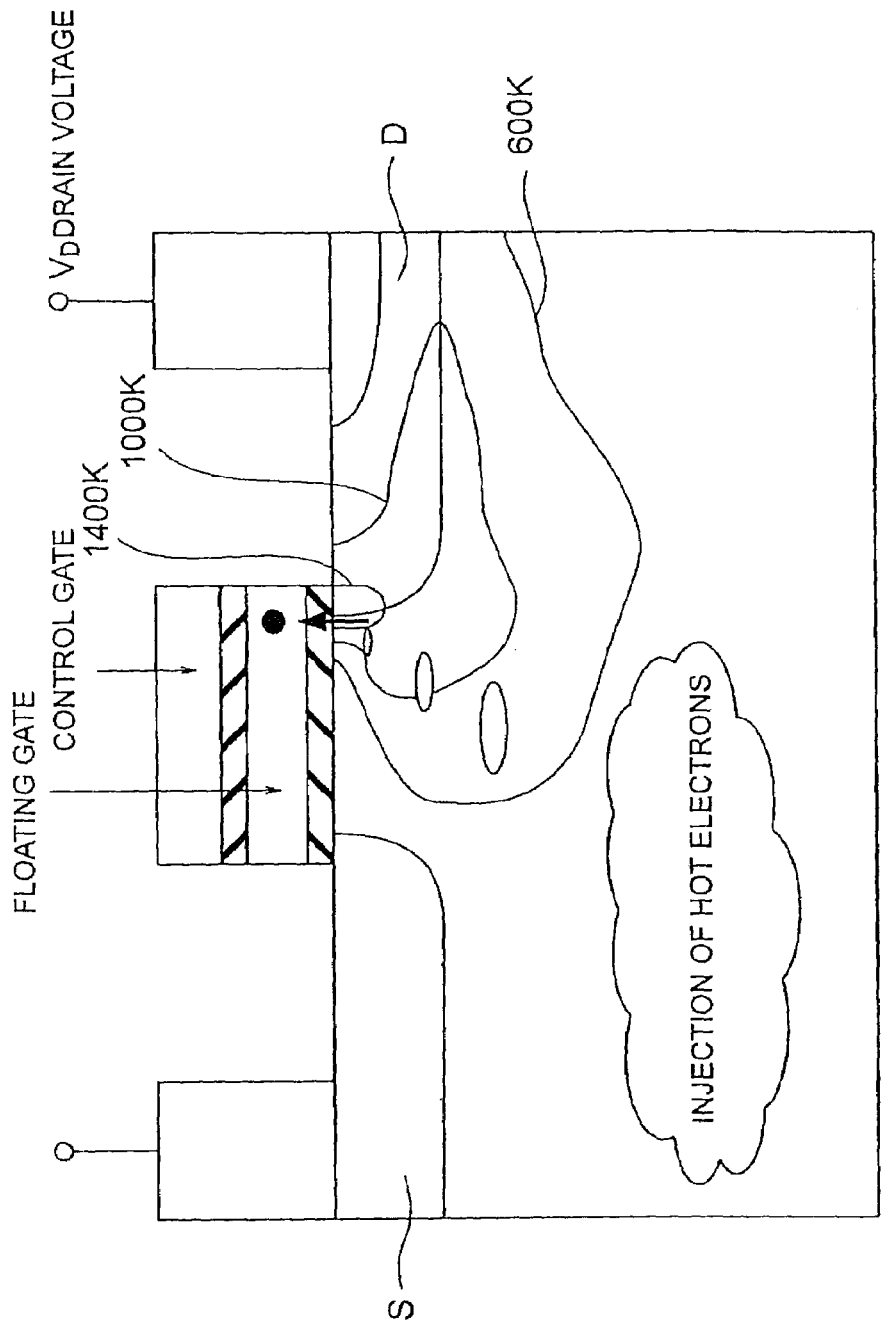
FIG. 5 is a diagram showing temperature distribution of hot electrons when a conventional writing method is used.
Figure 6:
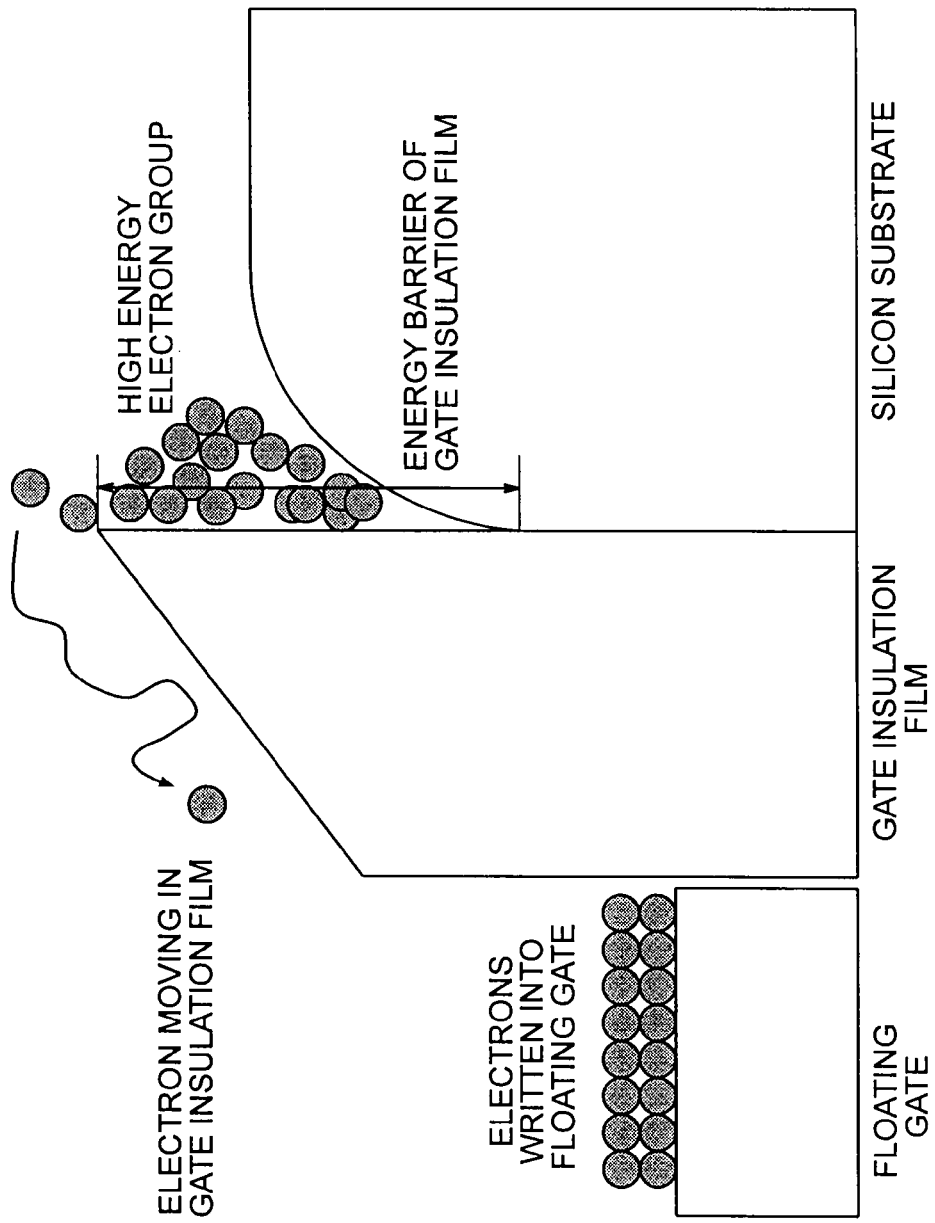
FIG. 6 is a diagram for explaining a concept of writing using hot electrons in a NOR type flash memory.

Temperature distribution (i.e., kinetic energy distribution) of the hot electrons at the time of writing is shown in FIG. 5. In FIG. 5, the voltage applied to the control gate continues to be kept at a predetermined voltage during the write operation unlike a writing method according to the present embodiment described later. As appreciated from FIG. 5, hot electrons located near the drain region D immediately before being injected into the floating gate have a temperature of approximately 1400 K. In the NOR type flash memory, writing is conducted by heating electrons which have traveled from the source region S with the voltage applied to the drain region D and injecting hot electrons into the floating gate 8 with the voltage applied to the control gate 12. In other words, hot electrons which have obtained high energy due to the voltage applied to the drain region D obtains energy high enough to exceed the barrier of the gate insulation film 6 and the hot electrons are written into the floating gate 8 as shown in FIG. 6.

A feature of writing in the memory cell MC of the NOR type flash memory is that the voltage applied to the control gate 12 during the write operation is opened. For example, the voltage (for example, 5V) is applied to the drain region D of a selected memory cell MC by the write circuit 20 on the basis of write data and the predetermined voltage (for example, 10 V) is applied to the control gate of the selected memory cell MC by the word line drive circuit 30, and then the voltage applied to the control gate 12 by the word line drive circuit 30 is opened. The opening of the voltage applied to the control gate 12 is performed by turning off a switch included in the word line drive circuit 30.

On the other hand, in the conventional writing, electrons are written into the floating gate by applying the voltage of 5 V to the drain region, applying the voltage of 10 V and thereby generating channel thermal electrons. In other words, in the conventional writing, the voltage applied to the control gate is kept at 10 V.

Figure 7:
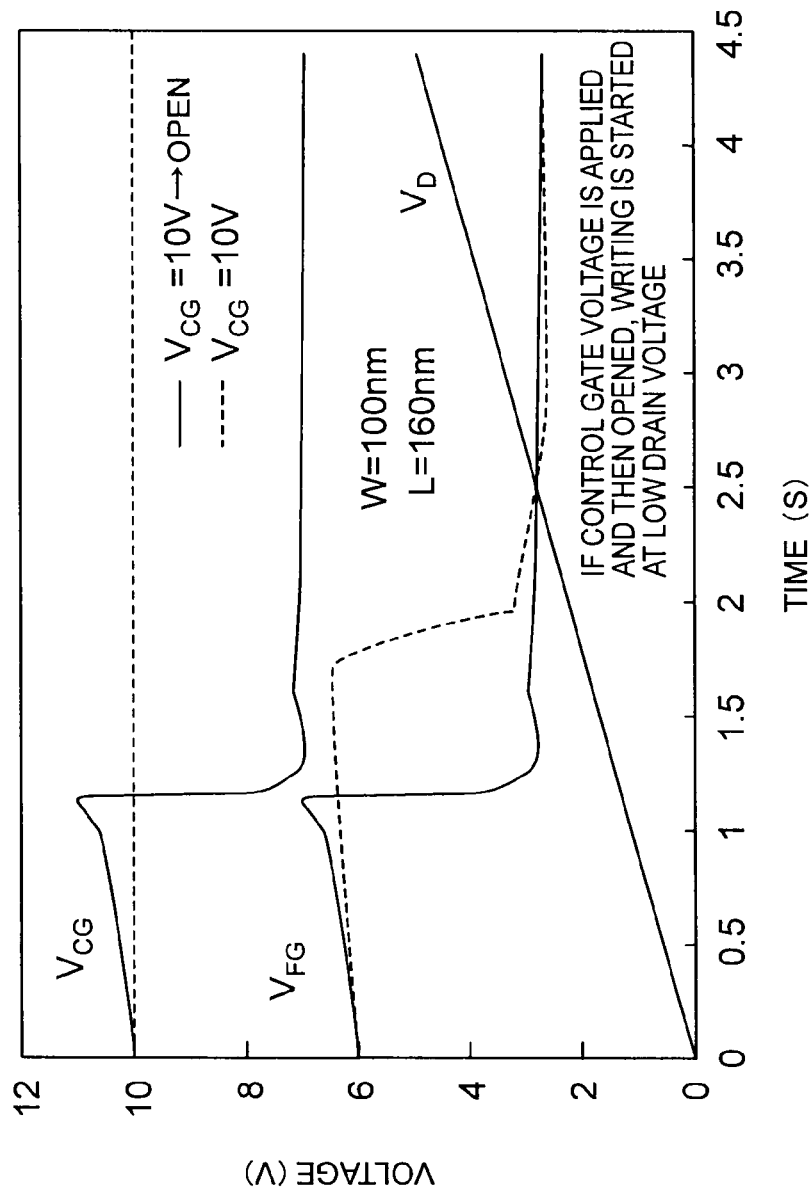
FIG. 7 is a simulation result diagram showing a change of a floating gate potential caused by writing in the non-volatile semiconductor memory device according to the first embodiment.

Simulation results of a potential $V_{FG}$ at the floating gate 8 obtained in the case where the voltage $V_{CG}$ applied to the control gate 12 is opened on the way as in the write operation according to the present embodiment and in the case where the voltage $V_{CG}$ applied to the control gate 12 is kept constant as in the conventional write operation are shown in FIG. 7. In this simulation, the potential $V_D$ supplied to the drain region D is raised from 0 V up to 5 V at a predetermined speed simultaneously with start of voltage application to the control gate 12. As for the size of the memory cell used in this simulation, a gate length L is 160 nm and a gate width W is 100 nm. The case where the voltage $V_{CG}$ applied to the control gate 12 is opened on the way as in the present embodiment is represented by solid lines. The case where the voltage $V_{CG}$ applied to the control gate 12 is kept constant as in the conventional write operation is represented by broken lines. Writing into the floating gate 8 is appreciated from lowering of the potential $V_{FG}$ at the floating gate 8 caused by injection of hot electrons into the floating gate 8. As appreciated from FIG. 7, writing is started at a lower drain voltage in the case where the voltage $V_{CG}$ applied to the control gate 12 is opened on the way as in the present embodiment as compared with the case where the voltage $V_{CG}$ applied to the control gate 12 is kept constant as in the conventional write operation. The writing efficiency is increased as the potential $V_{FG}$ at the floating gate becomes lower at an earlier time. In the operation scheme in which the voltage $V_{CG}$ of 10 V is applied to the control gate and then opening is conducted as in the present embodiment, therefore, the writing efficiency is higher as compared with the scheme in which the voltage $V_{CG}$ at the control gate is kept at 10 V as in the conventional write operation.

Figure 8:
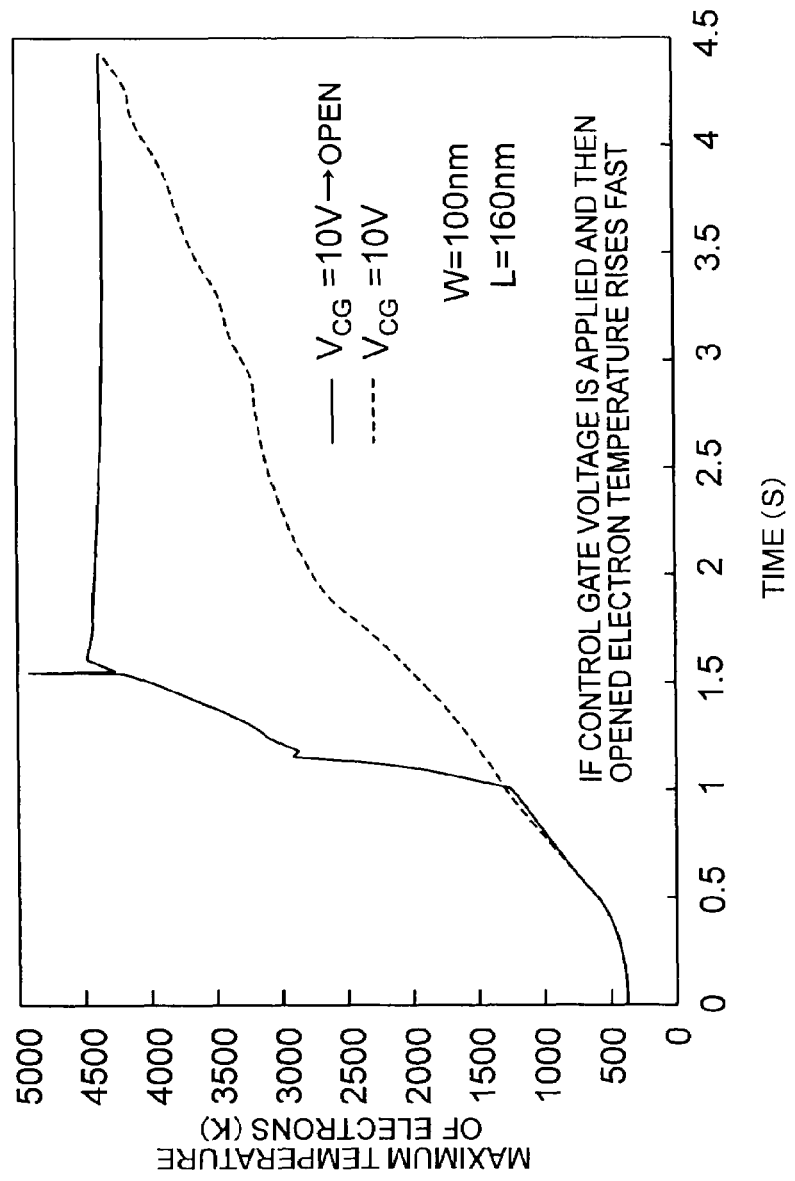
FIG. 8 is a simulation result diagram showing a change of a maximum temperature of electrons caused by writing in the non-volatile semiconductor memory device according to the first embodiment.
Figure 9:
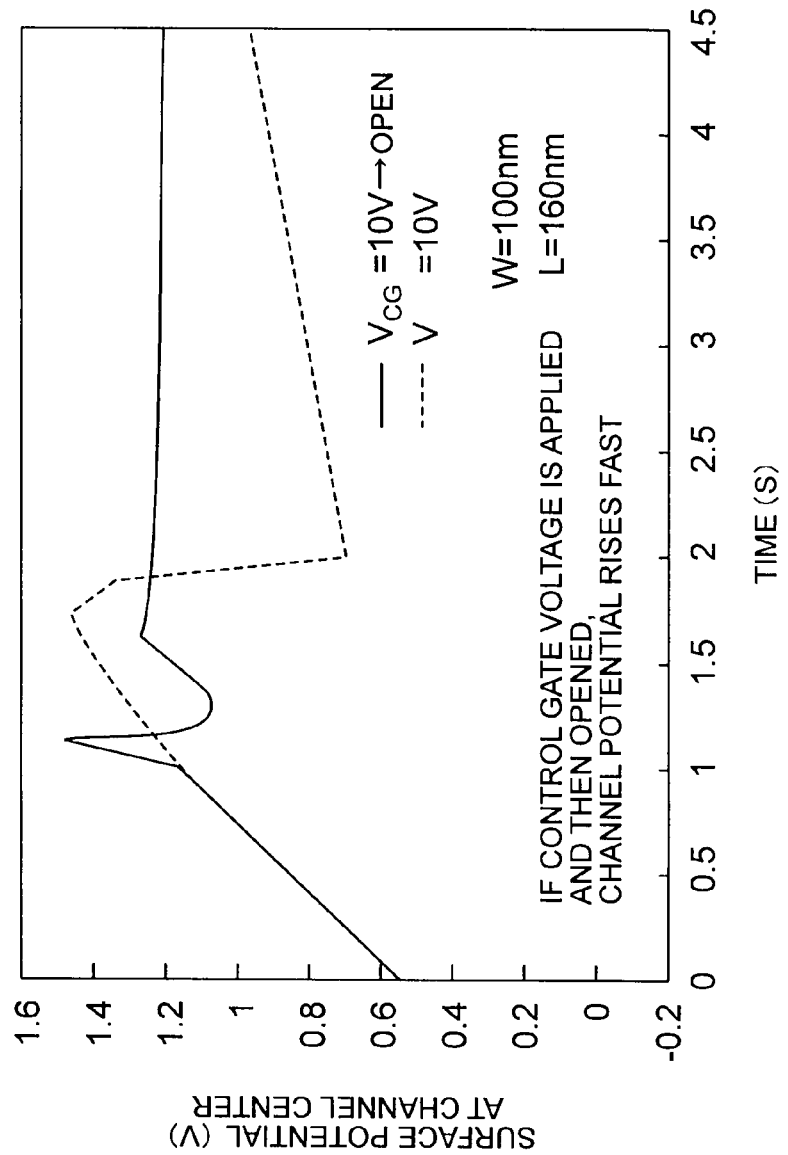
FIG. 9 is a simulation result diagram showing a change of the channel surface potential caused by writing in the non-volatile semiconductor memory device according to the first embodiment.

Simulation results of time response of maximum temperature of electrons in the semiconductor substrate 2 in the write operation according to the present embodiment and in the conventional write operation are shown in FIG. 8. A solid line indicates the time response obtained during the write operation according to the present embodiment. A broken line indicates the time response obtained during the conventional write operation. As appreciated from FIG. 8, the temperature becomes high at an earlier time in the write operation scheme according to the present embodiment. This is because the potential at the channel surface rises earlier in the write operation scheme according to the present embodiment as compared with the conventional write operation scheme as shown in FIG. 9. In other words, if the control gate 12 comes in the open state, controllability of the control gate 12 upon the channel 4 is reduced. This promotes the short channel effect obtained between the drain region D and the source region S. The short channel effect refers to a phenomenon in which the drain voltage influences upon the channel region. The hot electrons are generated by a potential difference between the source region S and the channel region 4. If the potential at the channel 4 rises earlier as in the present embodiment, the temperature rise of electrons also occurs earlier and consequently the writing efficiency is increased.

As for readout in the present embodiment, data in the memory cell MC is read out by applying a read voltage to a word line WL selected by the read circuit 40 and comparing a current of the selected memory cell which flows through the bit line BL with a reference current which flows through a reference cell (not illustrated).

According to the present embodiment, it is possible to provide a non-volatile semiconductor memory device having a high writing efficiency and its writing method as heretofore described.

Second Embodiment

Figure 10:
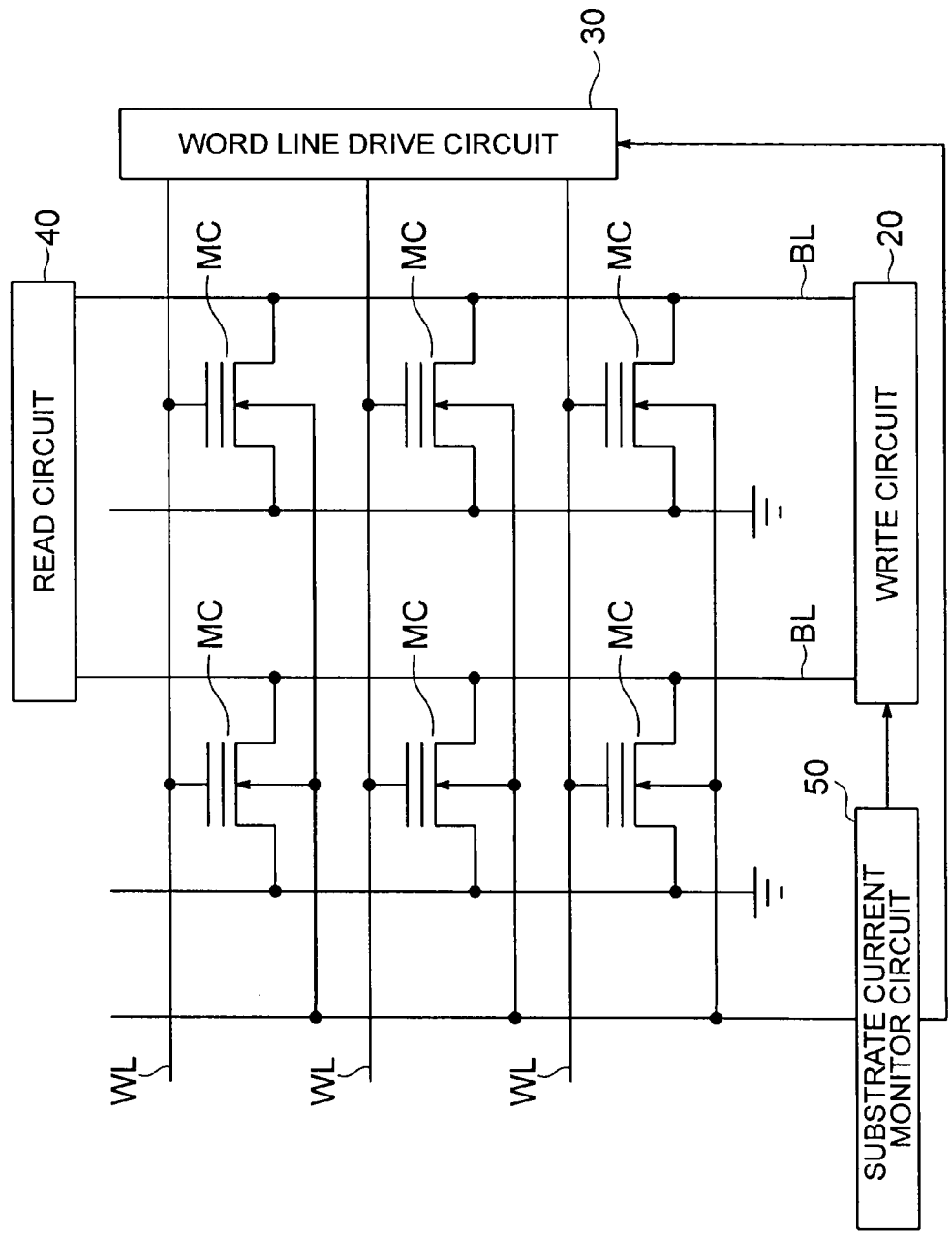
FIG. 10 is a circuit diagram showing a non-volatile semiconductor memory device according to a second embodiment.

A non-volatile semiconductor memory device according to a second embodiment of the present invention is shown in FIG. 10. The non-volatile semiconductor memory device according to the present embodiment is a NOR type flash memory, and has a configuration obtained by adding a substrate current monitor circuit 50 to the NOR type flash memory according to the first embodiment shown in FIG. 1.

The substrate current monitor circuit 50 conducts computation represented by the following expression. If the voltage $V_{FG}$ at the control gate 12 reaches a predetermined value, the substrate current monitor circuit 50 sends a control instruction to the write circuit 20 and the word line drive circuit 30 to change or open the voltage applied to the control gate.

$$V_{FG} = \frac{Q_{FG}}{C_{FG}} = \frac{\alpha \int I_G dt}{C_{FG}} = \frac{\alpha\beta \int I_{SUB} dt}{C_{FG}}$$

Here, $Q_{FG}$ is a charge amount in the floating gate 8, $C_{FG}$ is a capacitance seen from the floating gate 8, $\alpha$ is a writing efficiency of the gate current, $I_G$ is a gate current, t is write time, $\beta$ is a quantum efficiency of the substrate current with respect to the gate current, and $I_{SUB}$ is the substrate current. $C_{FG}$, $\alpha$ and $\beta$ become constants if the size and the like of the memory cell is determined. In other words, the substrate current monitor circuit 50 can obtain the voltage $V_{FG}$ of the control gate 12 by measuring the substrate current $I_{SUB}$ and integrating it.

Since the charge amount in the floating gate 8 can be obtained by using the substrate current monitor circuit 50, the verify operation can be omitted.

By the way, writing into the NOR type flash memory according to the present embodiment is conducted by using the utterly same method as the writing method described in the first embodiment. In other words, the voltage applied to the control gate 12 is opened during the write operation.

In the present embodiment as well, it is possible to provide a non-volatile semiconductor memory device having a high writing efficiency and its writing method in the same way as the first embodiment.

Third Embodiment

A writing method for a non-volatile semiconductor memory device according to a third embodiment of the present invention will now be described with reference to FIG. 11.

The writing method according to the present embodiment includes opening the voltage $V_{CG}$ applied to the control gate 12 by the word line drive circuit 30 in the NOR type flash memory according to the second embodiment shown in FIG. 10, conducts a write operation early, then confirming that the potential $V_{FG}$ at the floating gate 8 has reached a predetermined value by using the substrate current monitor circuit 50, and applying a predetermined voltage (for example, 10 V) to the control gate 12 again by using the word line drive circuit 30.

Figure 11:
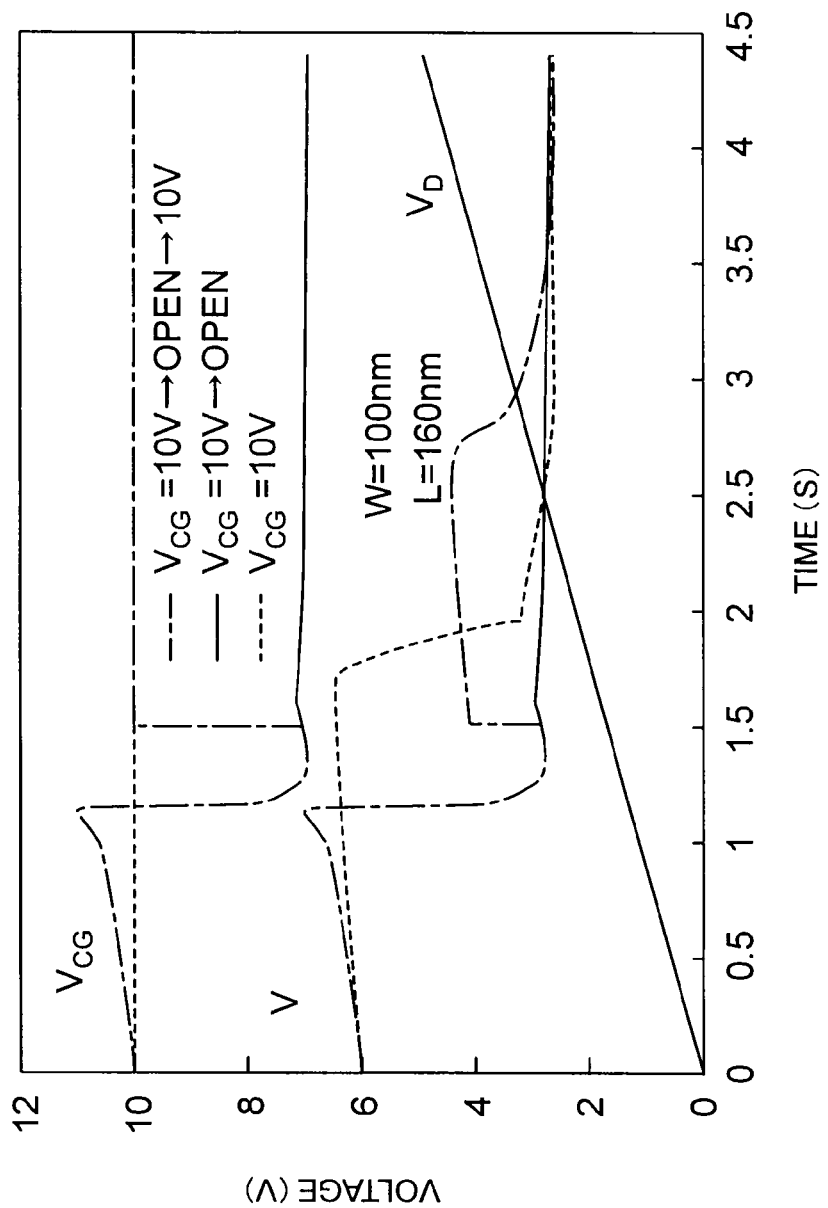
FIG. 11 is a simulation result diagram showing a change of a floating gate potential caused by writing in the non-volatile semiconductor memory device according to the second embodiment.

FIG. 11 shows simulation results of the potential $V_{FG}$ at the floating gate 8 in the case where the voltage $V_{CG}$ applied to the control gate 12 is opened on the way, then reaching of the potential $V_{FG}$ at the floating gate 8 at a predetermined value is confirmed, and the voltage is applied to the control gate 12 again (represented by alternate long and short dashed lines), in the case where the voltage $V_{CG}$ applied to the control gate 12 is opened on the way as in the first or second embodiment (represented by solid lines), and in the case where the voltage $V_{CG}$ applied to the control gate is kept constant as in the conventional write operation (represented by broken lines). In this simulation, the potential $V_D$ supplied to the drain region D is raised from 0 V to 5 V at a predetermined speed simultaneously with start of voltage application to the control gate 12. As for the size of the memory cell used in this simulation, the gate length L is 160 nm and the gate width W is 100 nm. In FIG. 11, the potential waveform at the floating gate 8 obtained when the writing method according to the present embodiment is used becomes the same as the potential waveform at the floating gate 8 obtained when the writing method according to the first embodiment is used, until immediately before the voltage $V_{CG}$ applied to the control gate 12 rises after being opened.

As appreciated from FIG. 11, the writing method according to the present embodiment makes it possible to further reduce the potential at the floating gate 8 and increase the number of hot electrons injected into the floating gate 8 as compared with the writing method according to the first embodiment. The writing method according to the present embodiment is effective in improving the writing efficiency in, for example, multi value writing.

In the present embodiment as well, it is possible to provide a non-volatile semiconductor memory device having a high writing efficiency and its writing method in the same way as the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A non-volatile semiconductor memory device comprising:
   a memory cell array;
   the memory cell array comprising:
   a plurality of non-volatile memory cells each including a source region and a drain region formed in a semiconductor substrate so as to be separated from each other, a gate insulation film formed on a region of the semiconductor substrate which serves as a channel region between the source region and the drain region, a floating gate formed on the gate insulation film, an inter-electrode insulation film formed on the floating gate, and a control gate formed on the inter-electrode insulation film;
   bit lines, to each of which the drain regions of the non-volatile memory cells in an identical column direction are connected in common, the source regions of the non-volatile memory cells in an identical column direction being connected to ground in common;
   word lines, to each of which the control gates of the non-volatile memory cells in an identical row direction are connected in common;
   a word line drive circuit configured to select one of the word lines based on a row address signal and apply a predetermined voltage to the selected word line; and
   a write circuit configured to generate a write voltage on the basis of write data, select one of the bit lines on the basis of a column address signal, and apply the write voltage to the selected bit line,
   wherein the word line drive circuit applies the predetermined voltage to the selected word line during a write operation, and then opens the voltage applied to the selected word line.

2. The device according to claim 1, further comprising a substrate current monitor circuit which monitors a substrate current flowing through the semiconductor substrate and calculates a potential at the floating gate of the memory cell during the write operation on the basis of the monitored substrate current.

3. The device according to claim 2, wherein
   the word line drive circuit opens the voltage applied to the selected word line during the write operation, and thereafter the word line drive circuit applies the predetermined voltage to the selected word line again, when the potential at the floating gate calculated by the substrate current monitor circuit has reached a predetermined value.

4. A non-volatile semiconductor memory device comprising:
   a non-volatile memory cell comprising a source region and a drain region formed in a semiconductor substrate so as to be separated from each other, a gate insulation film formed on a region of the semiconductor substrate which serves as a channel region between the source region and the drain region, a floating gate formed on the gate insulation film, an inter-electrode insulation film formed on the floating gate, and a control gate formed on the inter-electrode insulation film, source region being connected to ground;
   a bit line connected to the drain region of the non-volatile memory cell;
   a word line connected to the control gate of the non-volatile memory cell;
   a word line drive circuit configured to apply a predetermined voltage to the word line; and
   a write circuit configured to generate a write voltage on the basis of write data, and apply the write voltage to the bit line,
   wherein the word line drive circuit applies the predetermined voltage to the word line during a write operation, and then opens the voltage applied to the word line.

5. The device according to claim 4, further comprising a substrate current monitor circuit which monitors a substrate current flowing through the semiconductor substrate and calculates a potential at the floating gate of the memory cell during the write operation on the basis of the monitored substrate current.

6. The device according to claim 5, wherein
   the word line drive circuit opens the voltage applied to the word line during the write operation, and thereafter the word line drive circuit applies the predetermined voltage to the selected word line again, when the potential at the floating gate calculated by the substrate current monitor circuit has reached a predetermined value.

7. A writing method for a non-volatile semiconductor memory device, the non-volatile semiconductor memory device comprising:

a memory cell array;

the memory cell array comprising:

a plurality of non-volatile memory cells each including a source region and a drain region formed in a semiconductor substrate so as to be separated from each other, a gate insulation film formed on a region of the semiconductor substrate which serves as a channel region between the source region and the drain region, a floating gate formed on the gate insulation film, an inter-electrode insulation film formed on the floating gate, and a control gate formed on the inter-electrode insulation film;

bit lines, to each of which drain regions of the non-volatile memory cells in an identical column direction are connected in common, and source regions of non-volatile memory cells in an identical column direction are connected to ground in common; and word lines, to each of which the control gates of the non-volatile memory cells in an identical row direction are connected in common, the writing method comprising:

selecting one of the word lines on the basis of a row address signal and applying a predetermined voltage to the selected word line;

generating a write voltage on the basis of write data, selecting one of the bit lines on the basis of a column address signal, and applying the write voltage to the selected bit line, applying the predetermined voltage to the selected word line during a write operation, and then opening the voltage applied to the selected word line.

8. The writing method according to claim 7, further comprising monitoring a substrate current which flows through the semiconductor substrate, and calculating a potential at the floating gate in the memory cell during the write operation.

9. The method according to claim 8, further comprising, after opening the voltage applied to the selected word line, applying the predetermined voltage to the selected word line again when the calculated potential at the floating gate has reached a predetermined value.

* * * * *